US011934235B1

(12) United States Patent
Chen et al.

(10) Patent No.: US 11,934,235 B1
(45) Date of Patent: Mar. 19, 2024

(54) SERVER AND STORAGE MODULE (71) Applicant: Wiwynn Corporation, New Taipei (TW)

(72) Inventors: Shih-Hung Chen, New Taipei (TW); Cong-Wei Yang, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 17/965,794

(22) Filed: Oct. 14, 2022

(30) Foreign Application Priority Data

Aug. 31, 2022 (TW) .................................. 111132910

(51) Int. Cl.
*G06F 1/18* (2006.01)
*H05K 7/14* (2006.01)

(52) U.S. Cl.
CPC .............. *G06F 1/187* (2013.01); *G06F 1/188* (2013.01); *H05K 7/1489* (2013.01)

(58) Field of Classification Search
CPC .......... G06F 1/187; G06F 1/188; G06F 21/86; G06F 21/88; H05K 7/1489; H05K 5/0208
See application file for complete search history.

(56) References Cited

U.S. PATENT DOCUMENTS

| 7,760,086 | B2 * | 7/2010 | Hunter | H05K 1/0275 340/568.1 |
| 7,782,603 | B2 * | 8/2010 | Curnalia | G11B 33/122 361/679.55 |
| 7,903,401 | B2 * | 3/2011 | Lee | G06F 1/187 361/679.33 |
| 8,081,442 | B2 * | 12/2011 | Nakamura | G11B 33/122 361/679.33 |
| 9,460,605 | B2 * | 10/2016 | Köhler | G08B 21/18 |
| 10,114,429 | B1 * | 10/2018 | Shih | G11B 33/128 |
| 10,645,825 | B1 * | 5/2020 | Hurt | G08B 13/02 |
| 10,936,025 | B2 * | 3/2021 | Shih | G06F 1/185 |
| 2004/0100761 | A1 * | 5/2004 | Liu | G06F 1/184 361/679.02 |
| 2006/0049941 | A1 * | 3/2006 | Hunter | G08B 13/08 340/545.6 |
| 2006/0181845 | A1 * | 8/2006 | Shah | G11B 33/12 |
| 2006/0285287 | A1 * | 12/2006 | Chen | G06F 1/187 |
| 2007/0285885 | A1 * | 12/2007 | Lin | H05K 7/1412 361/807 |

(Continued)

FOREIGN PATENT DOCUMENTS

TW I762341 B 4/2022

*Primary Examiner* — Adrian S Wilson
(74) *Attorney, Agent, or Firm* — Winston Hsu (57) ABSTRACT

A server includes a chassis and a storage module. The storage module is disposed in the chassis. The storage module includes a base, a first electrical connector, a storage device, a connecting member and a first fixing member. A first side of the base has a first fixing portion. The first electrical connector is disposed at a second side of the base, wherein the second side is opposite to the first side. The storage device has a second electrical connector. The connecting member is connected to the storage device. The first fixing member is disposed on the connecting member. The second electrical connector is connected to the first electrical connector and the first fixing member is fixed to the first fixing portion, so as to fix the storage device on the base.

19 Claims, 10 Drawing Sheets

(56) References Cited

U.S. PATENT DOCUMENTS

| | | | |
|---|---|---|---|
| 2008/0158808 A1* | 7/2008 | Camarena | G11B 33/121 |
| | | | 361/752 |
| 2008/0239651 A1* | 10/2008 | Curnalia | G11B 33/122 |
| 2009/0279250 A1* | 11/2009 | Li | G06F 1/187 |
| | | | 361/679.58 |
| 2013/0099640 A1* | 4/2013 | Hu | G11B 33/124 |
| | | | 312/223.2 |
| 2018/0359876 A1* | 12/2018 | Hartman | H05K 5/0217 |

* cited by examiner

SERVER AND STORAGE MODULE

BACKGROUND OF THE INVENTION

1. Field of the Invention

The invention relates to a server and a storage module and, more particularly, to a storage module for installing a storage device in a chassis of a server and a server equipped with the storage module.

2. Description of the Prior Art

A server is used to serve various computers or portable electronic devices in network system. In general, a hard disk is a necessary component in the server. Since an E1.S solid state drive has advantages over a conventional solid state drive in terms of size, heat dissipating efficiency, storage capacity, maintainability, etc., the E1.S solid state drive has been widely used in the server. At present, all E1.S solid state drives are extracted from a front bezel of a chassis of the server. Thus, the E1.S solid state drive will occupy the setting space of input/output ports. Furthermore, the design of an extracting mechanism of the E1.S solid state drive is complicated, the cost is high, and an operating space of extracting the E1.S solid state drive needs to be retained in front of the chassis. Moreover, the E1.S solid state drive is easy to be extracted and it will cause harm to data security.

SUMMARY OF THE INVENTION

The invention provides a storage module for installing a storage device in a chassis of a server and a server equipped with the storage module, so as to solve the aforesaid problems.

According to an embodiment of the invention, a server comprises a chassis and a storage module. The storage module is disposed in the chassis. The storage module comprises a base, a first electrical connector, a storage device, a connecting member and a first fixing member. A first side of the base has a first fixing portion. The first electrical connector is disposed at a second side of the base, wherein the second side is opposite to the first side. The storage device has a second electrical connector. The connecting member is connected to the storage device. The first fixing member is disposed on the connecting member. The second electrical connector is connected to the first electrical connector and the first fixing member is fixed to the first fixing portion, so as to fix the storage device on the base.

According to another embodiment of the invention, a storage module comprises a base, a first electrical connector, a storage device, a connecting member and a first fixing member. A first side of the base has a first fixing portion. The first electrical connector is disposed at a second side of the base, wherein the second side is opposite to the first side. The storage device has a second electrical connector. The connecting member is connected to the storage device. The first fixing member is disposed on the connecting member. The second electrical connector is connected to the first electrical connector and the first fixing member is fixed to the first fixing portion, so as to fix the storage device on the base.

As mentioned in the above, the invention disposes the first electrical connector on the base. To assemble the storage module to the chassis, a user may first fix the base with the first electrical connector to the chassis and connect the connecting member with the first fixing member to the storage device. Then, the user may connect the second electrical connector of the storage device to the first electrical connector and fix the first fixing member to the first fixing portion of the base. Accordingly, the storage device is installed in the chassis of the server by the base. When the user wants to maintain or replace the storage device, the user only needs to detach the first fixing member from the first fixing portion of the base and separate the second electrical connector of the storage device from the first electrical connector, and then the storage device can be detached from the base. Since the storage device is installed in the chassis of the server, a front bezel of the chassis may retain more space for setting input/output ports and/or other components, and the storage device is not easy to be taken. Furthermore, the storage device is detachably fixed on the base by the first electrical connector, the second electrical connector, the first fixing member and the first fixing portion, so the structure is simple. The invention does not need to use complicated extracting mechanism, so the cost can be further reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
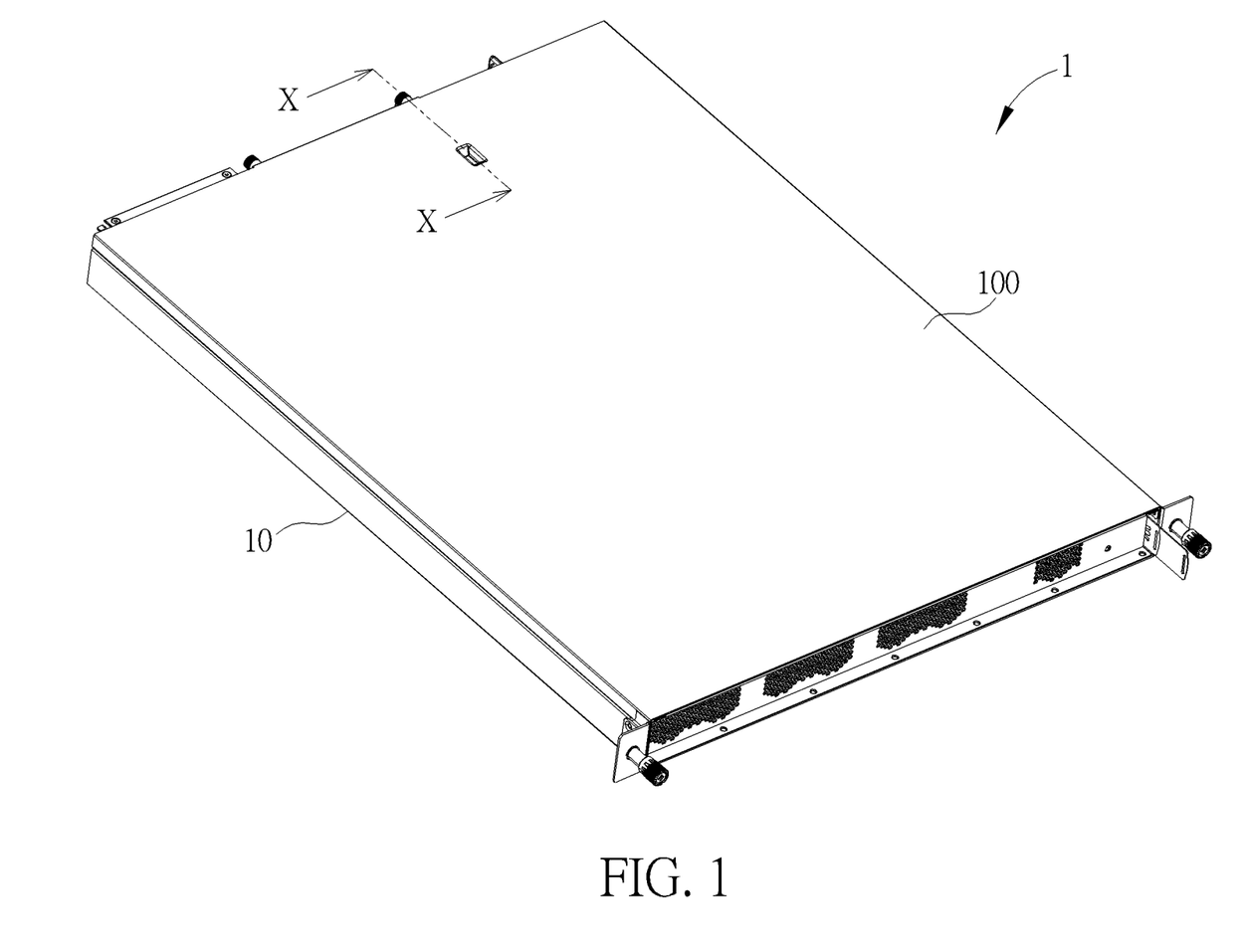
FIG. 1 is a perspective view illustrating a server according to an embodiment of the invention.
Figure 2:
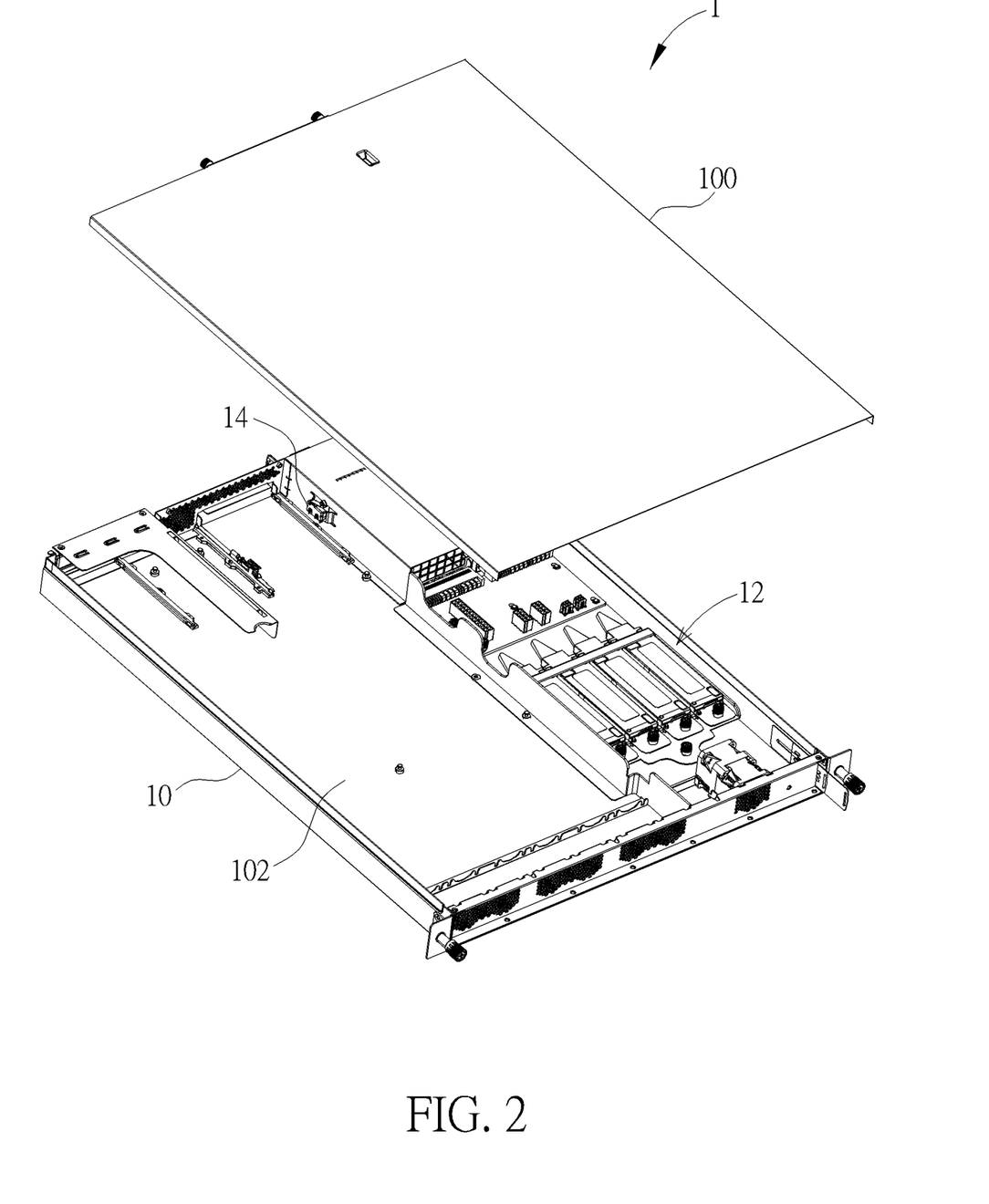
FIG. 2 is a perspective view illustrating a cover of a chassis shown in FIG. 1 being opened.
Figure 3:
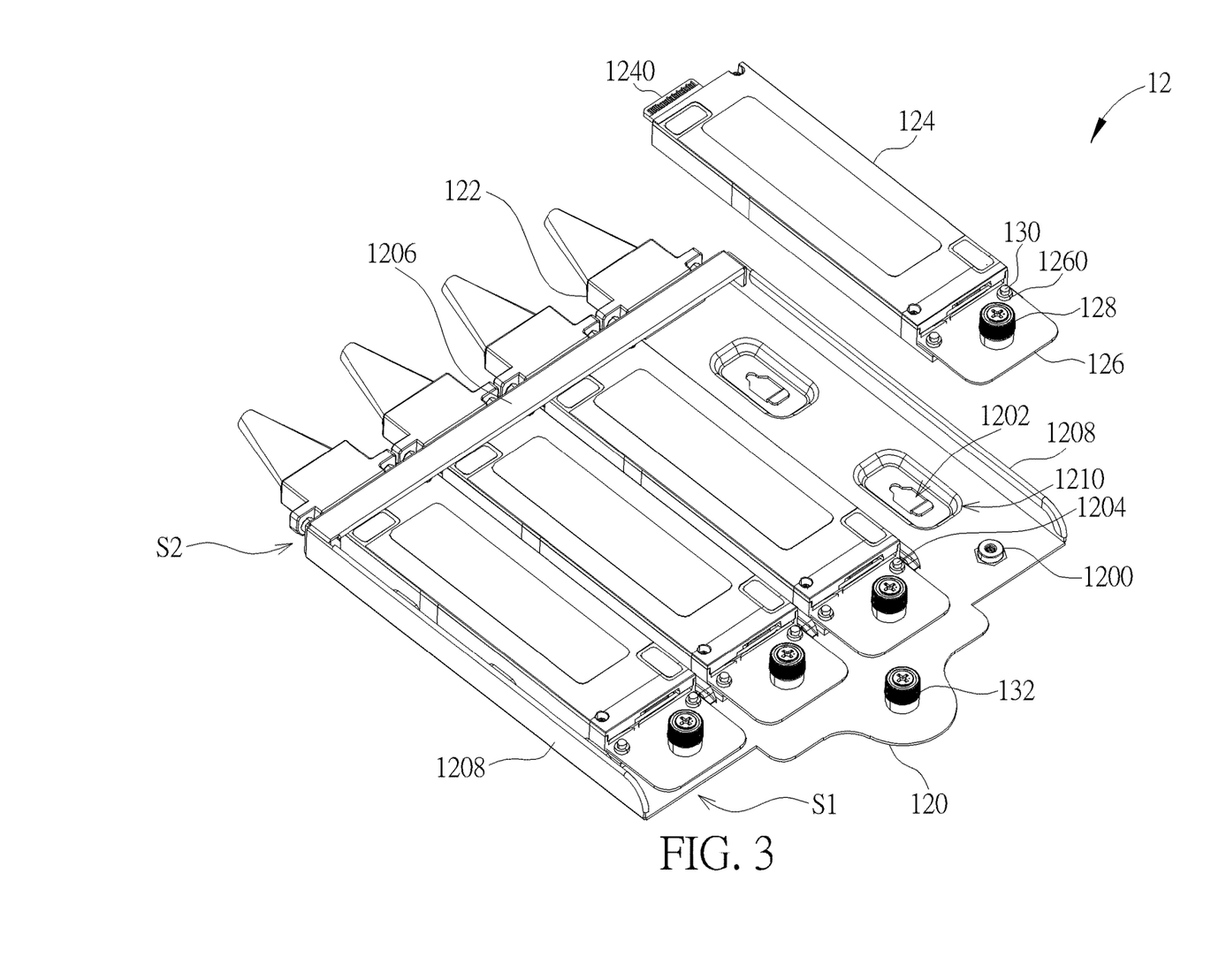
FIG. 3 is a perspective view illustrating a storage module shown in FIG. 2.
Figure 4:
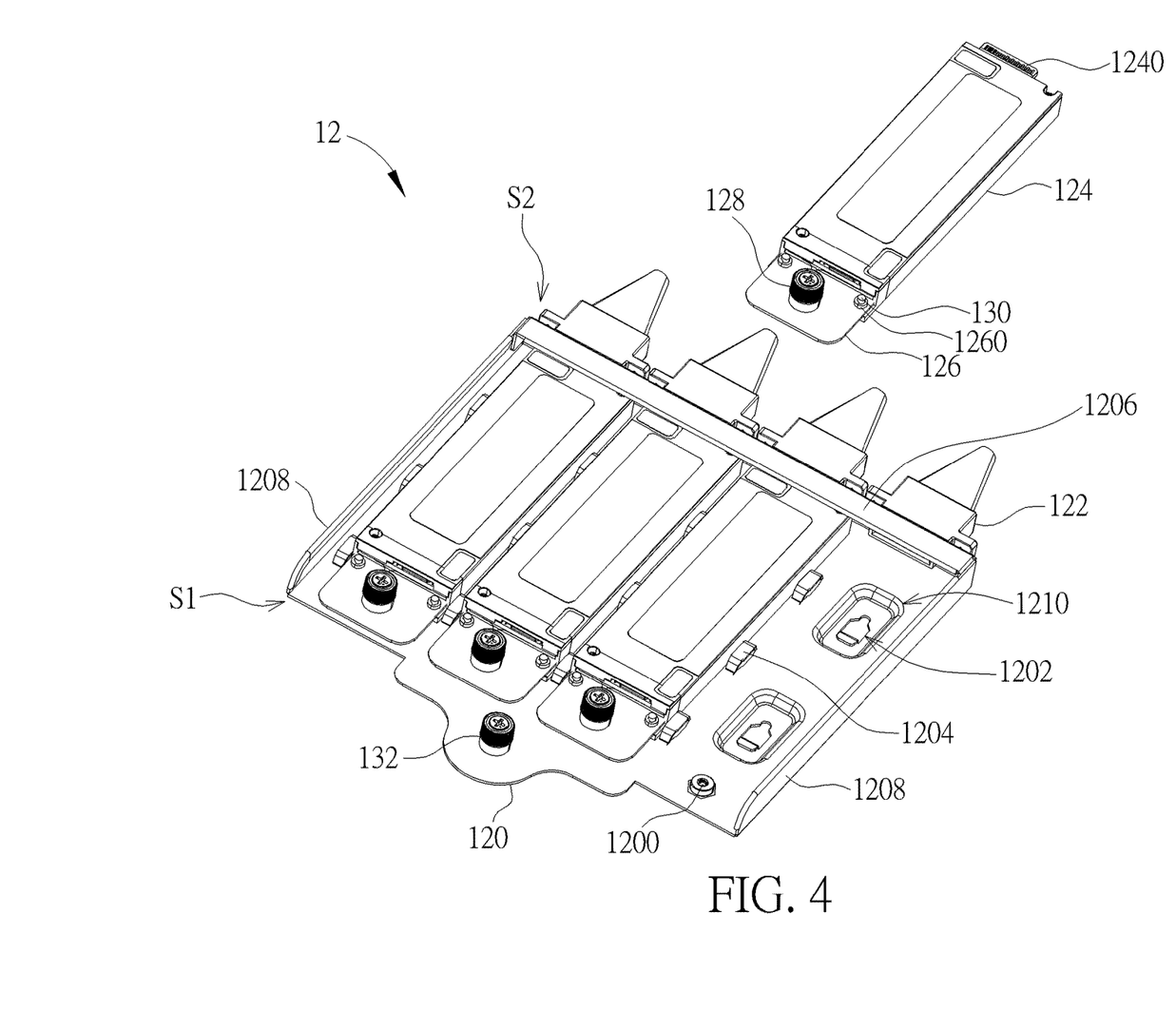
FIG. 4 is a perspective view illustrating the storage module shown in FIG. 3 from another viewing angle.
Figure 5:
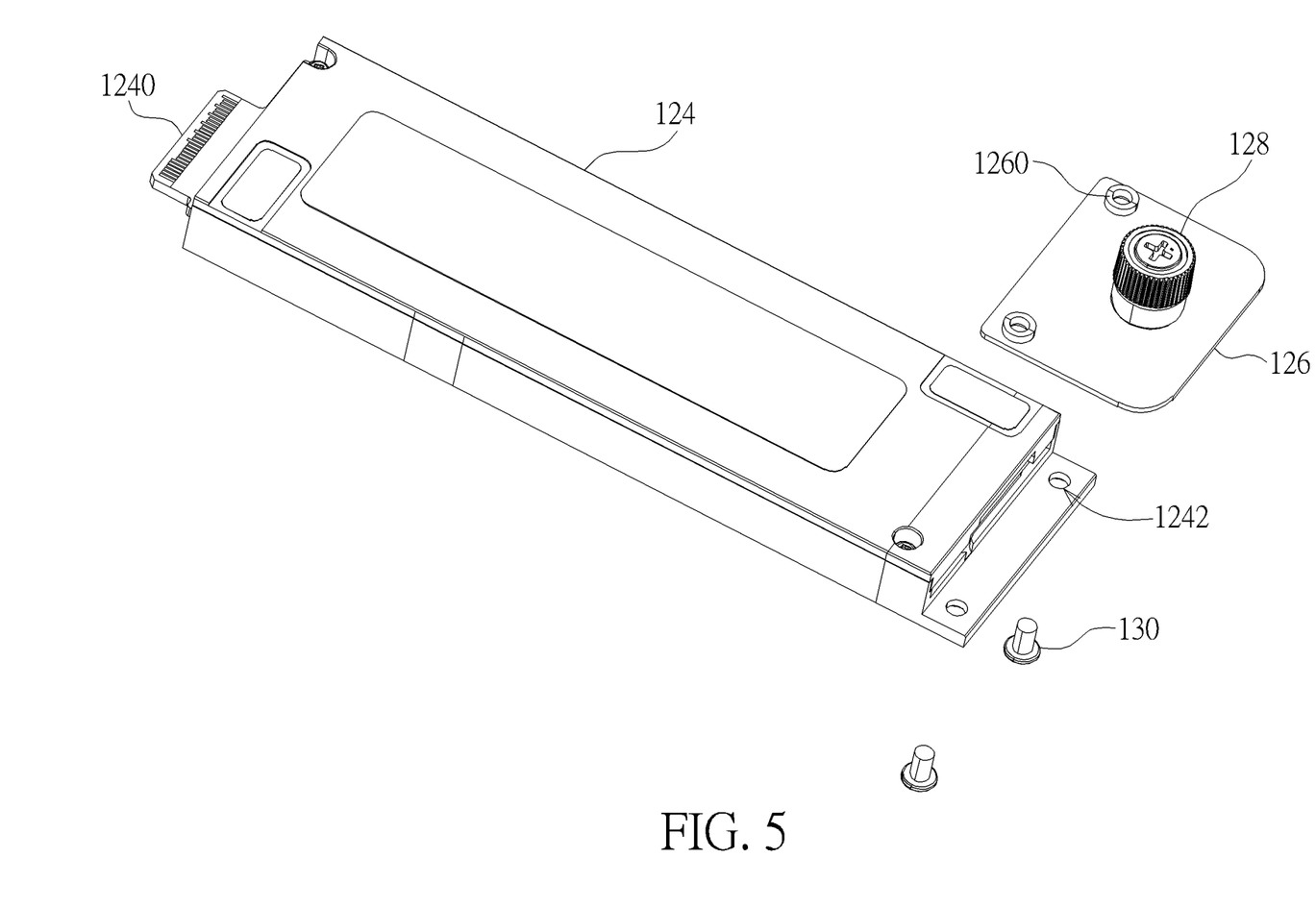
FIG. 5 is an exploded view illustrating a storage device and a connecting member shown in FIG. 3.
Figure 6:
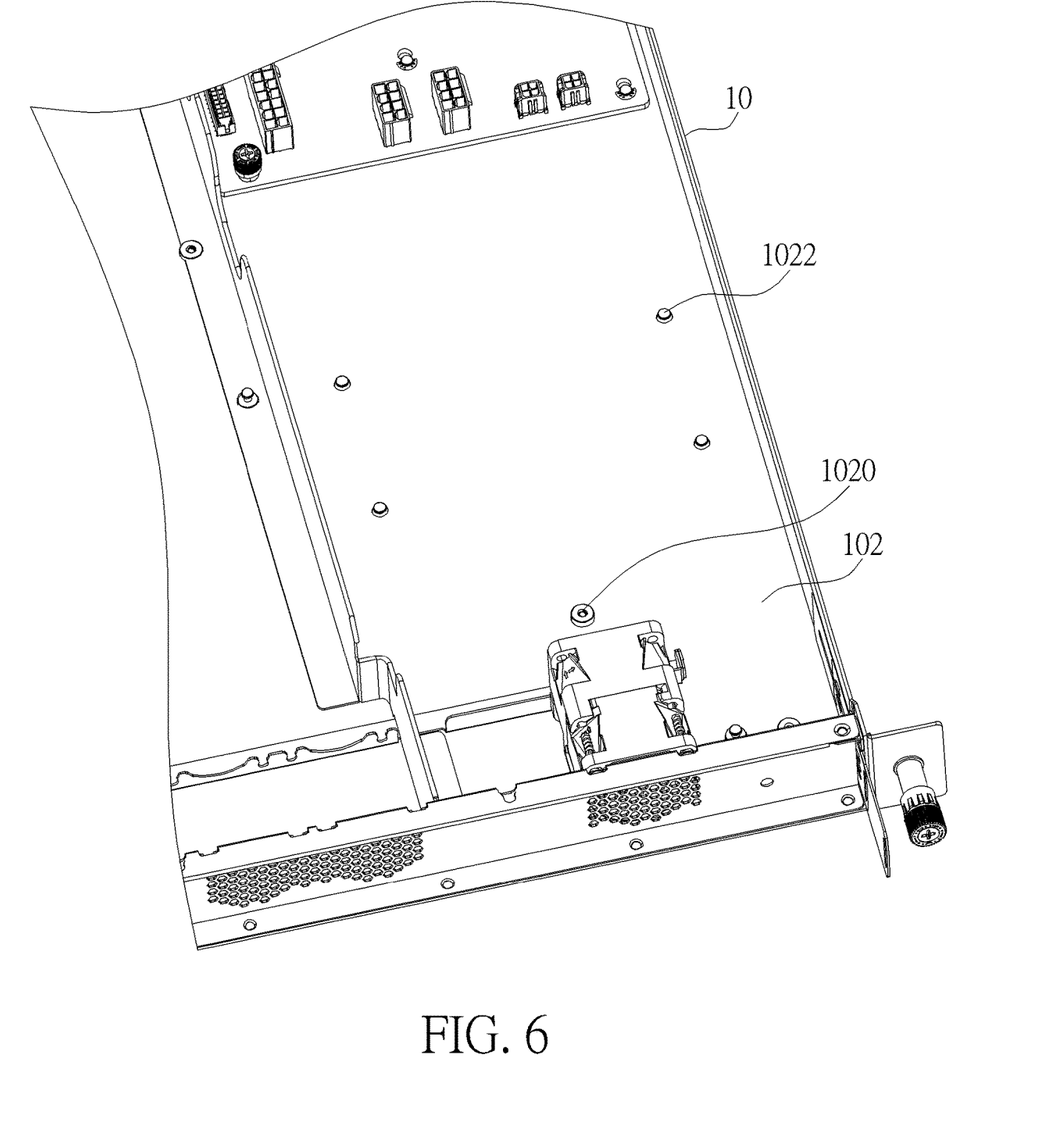
FIG. 6 is a partial perspective view illustrating a bottom plate of the chassis shown in FIG. 2.
Figure 7:
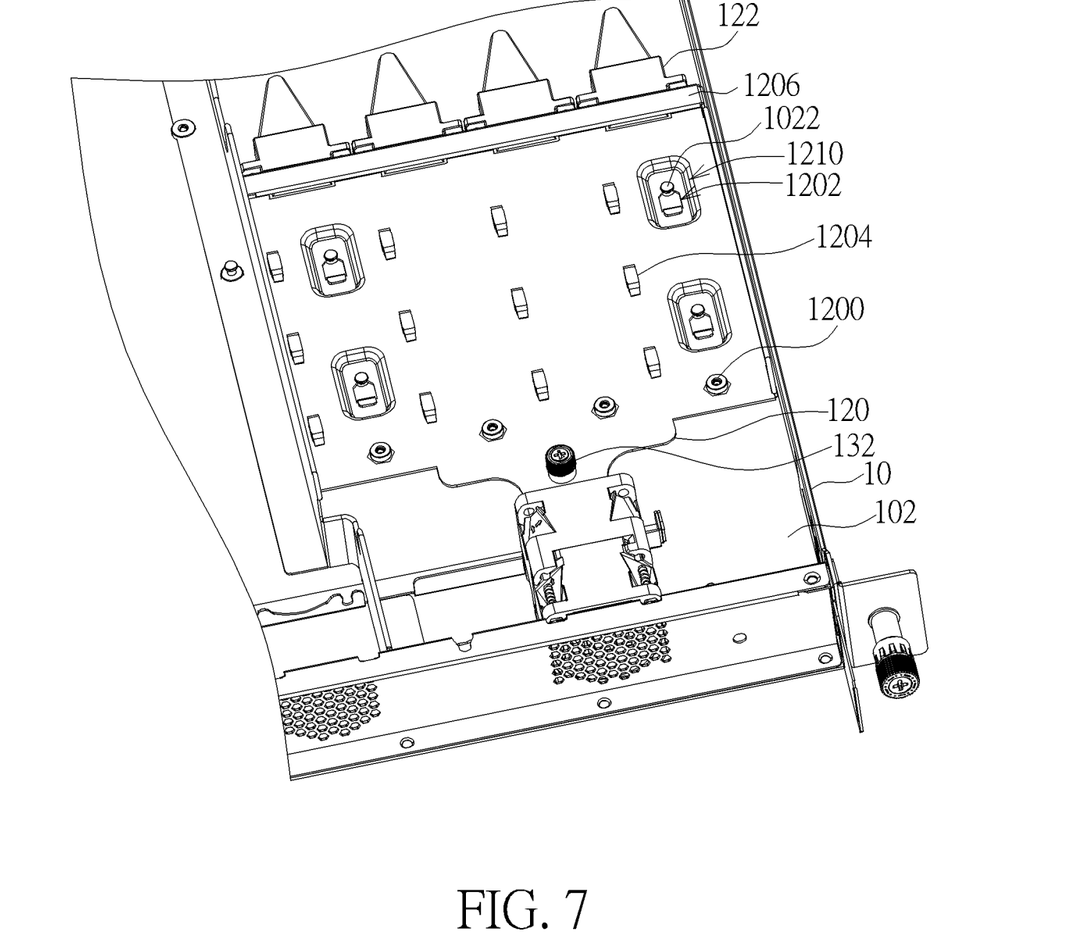
FIG. 7 is a perspective view illustrating a base fixed to the bottom plate shown in FIG. 6.
Figure 8:
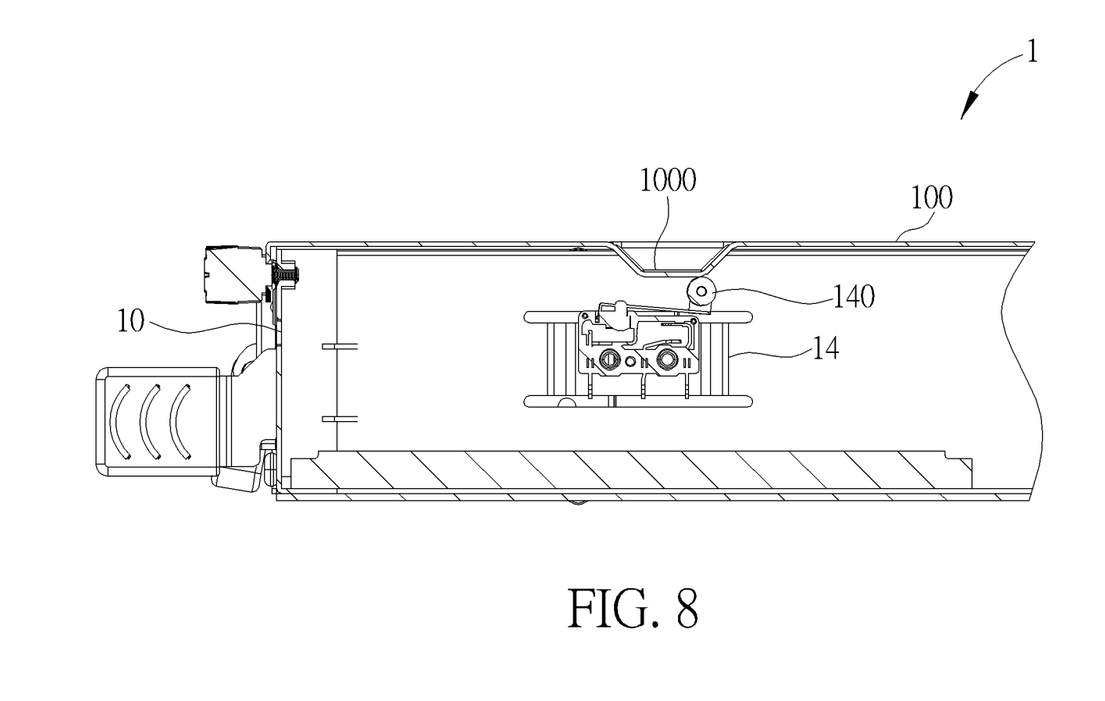
FIG. 8 is a sectional view illustrating the server shown in FIG. 1.
Figure 9:
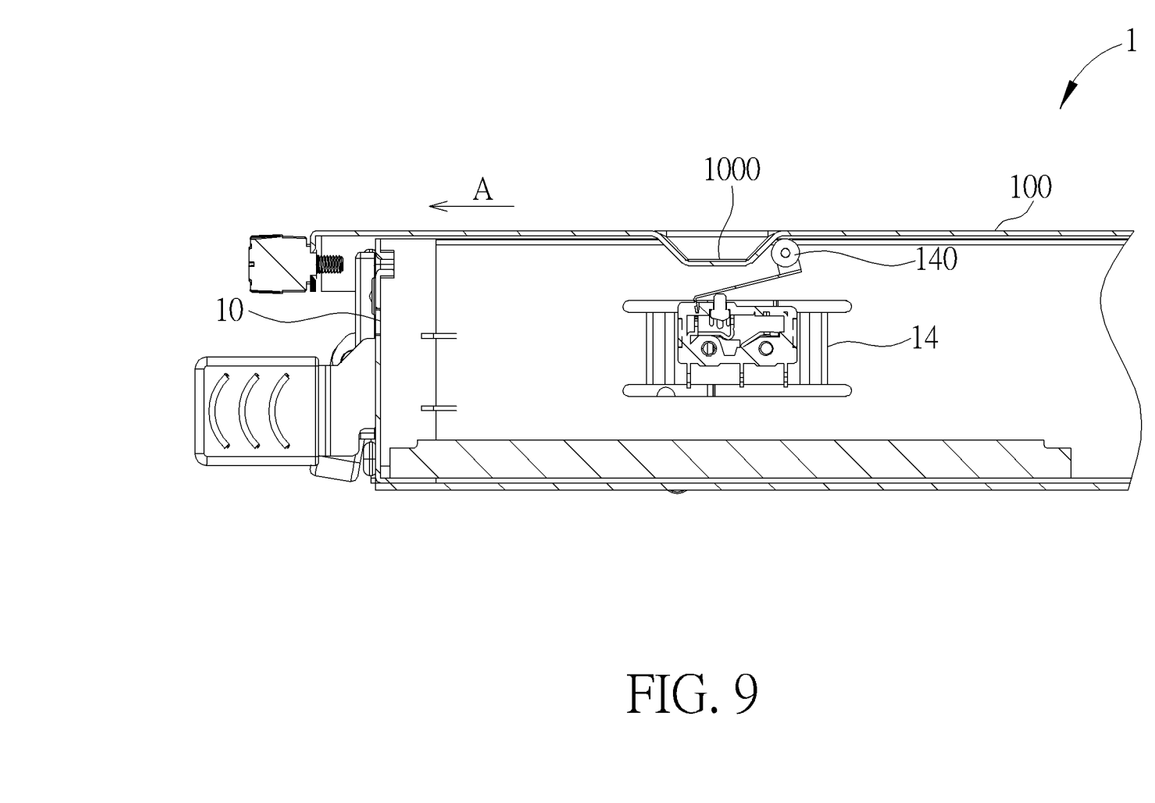
FIG. 9 is a sectional view illustrating the cover shown in FIG. 8 being opened.
Figure 10:
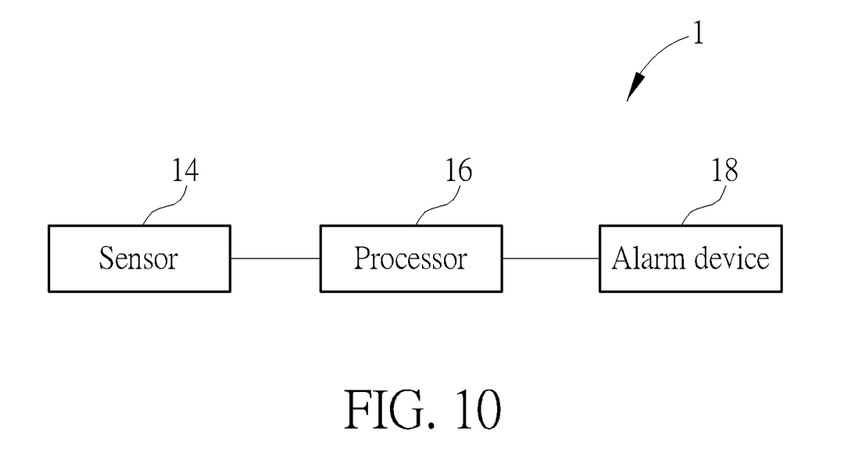
FIG. 10 is a functional block diagram illustrating the server shown in FIG. 1.

Referring to FIGS. 1 to 10, FIG. 1 is a perspective view illustrating a server 1 according to an embodiment of the invention, FIG. 2 is a perspective view illustrating a cover 100 of a chassis shown in FIG. 1 being opened, FIG. 3 is a perspective view illustrating a storage module 12 shown in FIG. 2, FIG. 4 is a perspective view illustrating the storage module 12 shown in FIG. 3 from another viewing angle, FIG. 5 is an exploded view illustrating a storage device 124 and a connecting member 126 shown in FIG. 3, FIG. 6 is a partial perspective view illustrating a bottom plate 102 of the chassis 10 shown in FIG. 2, FIG. 7 is a perspective view illustrating a base 120 fixed to the bottom plate 102 shown in FIG. 6, FIG. 8 is a sectional view illustrating the server 1 shown in FIG. 1 along line X-X, FIG. 9 is a sectional view illustrating the cover 100 shown in FIG. 8 being opened, and FIG. 10 is a functional block diagram illustrating the server 1 shown in FIG. 1.

As shown in FIGS. 1 and 2, the server 1 comprises a chassis and a storage module 12, wherein the storage module 12 is disposed in the chassis 10. In this embodiment, the chassis 10 may comprise a cover 100 and a bottom plate 102. The storage module 12 is disposed on the bottom plate 102 and the cover 100 covers the storage module 12. In general, the server 1 may be further equipped with some necessary hardware and software components for specific purposes, such as circuit board, processor, memory, power supply, applications, communication module, etc., and it depends on practical applications.

As shown in FIGS. 3 and 4, the storage module 12 comprises a base 120, a first electrical connector 122, a storage device 124, a connecting member 126 and a first fixing member 128. In this embodiment, the storage module 12 may comprise four first electrical connectors 122, four storage devices 124, four connecting members 126 and four first fixing members 128, but the invention is not so limited. The number of first electrical connectors 122, storage devices 124, connecting members 126 and first fixing members 128 may be determined according to practical applications. In this embodiment, the storage device 124 may be, but is not limited to, an E1.S solid state drive.

A first side S1 of the base 120 has a first fixing portion 1200 and the first electrical connector 122 is disposed at a second side S2 of the base 120, wherein the second side S2 is opposite to the first side S1. In this embodiment, the first fixing portion 1200 may be a screw hole. Furthermore, the storage device 124 has a second electrical connector 1240. The second electrical connector 1240 is configured to be connected to the first electrical connector 122 and the first fixing member 128 is configured to be fixed to the first fixing portion 1200 of the base 120, so as to fix the storage device 124 on the base 120. In this embodiment, the first electrical connector 122 may be a slot connector and the second electrical connector 1240 may be a card edge connector. Thus, the second electrical connector 1240 may be inserted into the first electrical connector 122, such that the second electrical connector 1240 is electrically connected to the first electrical connector 122.

The connecting member 126 is connected to the storage device 124 and the first fixing member 128 is disposed on the connecting member 126. In this embodiment, the first fixing member 128 may be, but is not limited to, a thumb screw rotatably disposed on the connecting member 126. As shown in FIG. 5, the storage device 124 has a through hole 1242, the connecting member 126 has a second fixing portion 1260, and the storage module 12 further comprises a second fixing member 130. In this embodiment, the storage device may have two through holes 1242, the connecting member 126 may have two second fixing portions 1260, and the storage module 12 may comprise two second fixing members 130, wherein the second fixing portion 1260 may be a screw hole and the second fixing member 130 may be a screw. The second fixing member 130 may pass through the through hole 1242 to be fixed to the second fixing portion 1260, so as to connect the connecting member 126 to the storage device 124.

As shown in FIGS. 3, 4 and 7, the storage module 12 further comprises a third fixing member 132 and the base 120 has an engaging groove 1202. The third fixing member 132 is disposed on the first side S1 of the base 120. In this embodiment, the third fixing member 132 may be, but is not limited to, a thumb screw rotatably disposed on the first side S1 of the base 120. Furthermore, as shown in FIG. 6, the bottom plate 102 of the chassis 10 has a third fixing portion 1020 and an engaging portion 1022. In this embodiment, the bottom plate 102 of the chassis 10 may have four engaging portions 1022 and the base 120 may have four engaging grooves 1202, wherein the engaging groove 1202 may be, but is not limited to, a gourd-shaped hole and the engaging portion 1022 may be, but is not limited to, an I-shaped pin. In this embodiment, the third fixing portion 1020 may be a screw hole. The engaging portion 1022 of the bottom plate 102 is configured to engage with the engaging groove 1202 of the base 120 and the third fixing member 132 is configured to be fixed to the third fixing portion 1020 of the bottom plate 102, so as to fix the base 120 on the bottom plate 102.

To assemble the storage module 12 to the chassis 10, a user may place the base 120 with the first electrical connector 122 into the chassis 10 first, as shown in FIG. 7. When the base 120 is placed into the chassis 10, the user may make the engaging portion 1022 pass through the bigger hole of the engaging groove 1202 first and then move the base 120 to make the engaging portion 1022 engage with the smaller hole of the engaging groove 1202. Then, the user fixes the third fixing member 132 to the third fixing portion 1020, such that the base 120 is fixed on the bottom plate 102. Furthermore, the user may connect the connecting member 126 with the first fixing member 128 to the storage device 124. Then, the user may connect the second electrical connector 1240 of the storage device 124 to the first electrical connector 122 and then fix the first fixing member 128 to the first fixing portion 1200 of the base 120, such that the storage device 124 is fixed on the base 120. Accordingly, the storage device 124 is disposed in the chassis 10 of the server 1 by the base 120. When the user wants to maintain or replace the storage device 124, the user only needs to detach the first fixing member 128 from the first fixing portion 1200 of the base 120 and separate the second electrical connector 1240 of the storage device 124 from the first electrical connector 122, and then the storage device 124 can be detached from the base 120.

As shown in FIG. 4, the base 120 may have a guiding structure 1204. In this embodiment, the guiding structure 1204 may be, but is not limited to, an embossed structure. The guiding structure 1204 is configured to guide the storage device 124 to align the second electrical connector 1240 with the first electrical connector 122. In this embodiment, the guiding structure 1204 may be correspondingly formed at one or two sides of the storage device 124 according to practical applications.

As shown in FIGS. 3 and 4, the second side S2 of the base 120 may have a restraining portion 1206. In this embodiment, the base 120 has two side walls 1208 and the two side walls 1208 are opposite to each other. The restraining portion 1206 may be connected to the two side walls 1208. After the second electrical connector 1240 is connected to the first electrical connector 122, the restraining portion 1206 is located above an end of the storage device 124 close to the second electrical connector 1240. The restraining portion 1206 may restrain the end of the storage device 124 close to the second electrical connector 1240 from shaking, such that the storage 124 is stably disposed on the base 120.

As shown in FIG. 7, the base 120 may have an avoidance recess 1210 and the engaging groove 1202 is located in the avoidance recess 1210. Accordingly, when the storage device 124 is disposed on the base 120, the engaging portion 1022 will not interfere with the storage device 124. In this embodiment, there are four avoidance recesses 1210 corresponding to the four engaging grooves 1202, but the invention is not so limited.

As shown in FIG. 2, the server 1 may further comprise a sensor 14 disposed in the chassis 10. The sensor 14 is configured to sense whether the cover 100 is opened. As shown in FIG. 8, the cover 100 may have a protruding portion 1000 and a position of the protruding portion 1000 corresponds to a position of the sensor 14. Furthermore, as shown in FIG. 10, the server 1 may further comprise a processor 16 and an alarm device 18, wherein the processor 16 is coupled to the sensor 14 and the alarm device 18.

As shown in FIG. 8, when the cover 100 is not opened, the protruding portion 1000 abuts against a sensing end 140 of the sensor 14. As shown in FIG. 9, when the cover 100 moves in a direction of an arrow A to be opened, the protruding portion 1000 moves away from the sensing end 140 of the sensor 14, such that the sensor 14 outputs a sensing signal. For further explanation, when someone wants to steal the storage device 124, he/she has to open the cover 100 first. When the cover 100 is opened, the sensor 14 will output the sensing signal to the processor 16. At this time, the processor 16 will control the alarm device 18 to send out a warning message according to the sensing signal to notify a person in charge of monitoring. Accordingly, the invention may prevent the storage device 124 from being stolen, thereby achieving the purpose of protecting data security. In this embodiment, the sensor 14 may be, but is not limited to, a contact sensor (e.g. limit switch). Furthermore, the alarm device 18 may be a display device, a speaker, a light emitting component or a combination thereof, and the warning message may be an image, text, sound, light or a combination thereof according to practical applications.

Figure 11:
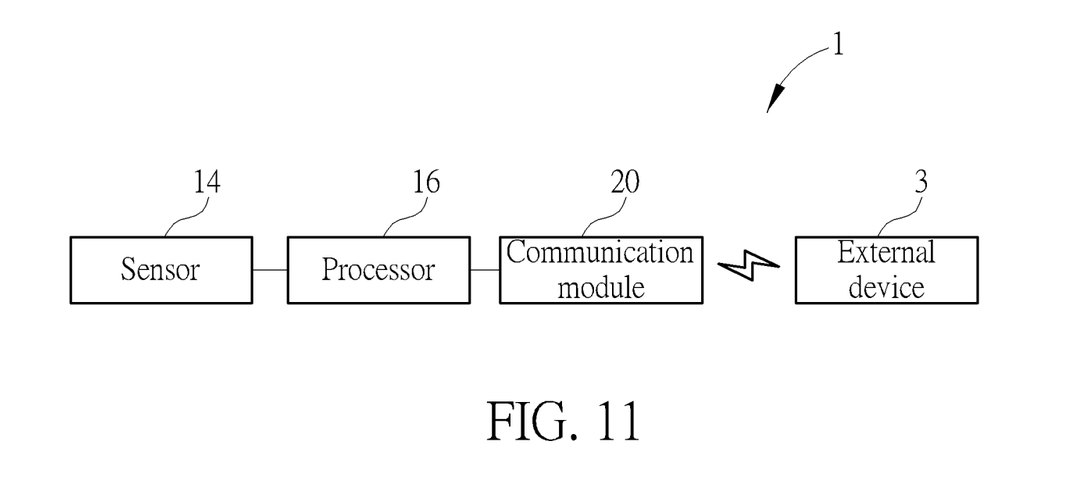
FIG. 11 is a functional block diagram illustrating the server according to another embodiment of the invention.

As shown in FIG. 11, FIG. 11 is a functional block diagram illustrating the server 1 according to another embodiment of the invention. As shown in FIG. 11, the server 1 may further comprise a communication module 20, wherein the processor 16 is coupled to the sensor 14 and the communication module 20. In this embodiment, when the cover 100 is opened, the sensor 14 will output the sensing signal to the processor 16. At this time, the processor 16 will control the communication module 20 to send out a warning message to an external device 3 according to the sensing signal to notify a person in charge of monitoring. Accordingly, the invention may prevent the storage device 124 from being stolen, thereby achieving the purpose of protecting data security. In this embodiment, the communication module 20 may be a Wi-Fi communication module, a Bluetooth communication module or other wireless communication modules according to practical applications. Furthermore, the external device 3 may be a mobile phone, a tablet computer or other electronic devices according to practical applications.

In another embodiment, the server 1 may also comprise the aforesaid alarm device 18 and communication module 20 at the same time according to practical applications.

As mentioned in the above, the invention disposes the first electrical connector on the base. To assemble the storage module to the chassis, a user may first fix the base with the first electrical connector to the chassis and connect the connecting member with the first fixing member to the storage device. Then, the user may connect the second electrical connector of the storage device to the first electrical connector and fix the first fixing member to the first fixing portion of the base. Accordingly, the storage device is installed in the chassis of the server by the base. When the user wants to maintain or replace the storage device, the user only needs to detach the first fixing member from the first fixing portion of the base and separate the second electrical connector of the storage device from the first electrical connector, and then the storage device can be detached from the base. Since the storage device is installed in the chassis of the server, a front bezel of the chassis may retain more space for setting input/output ports and/or other components, and the storage device is not easy to be taken. Furthermore, the storage device is detachably fixed on the base by the first electrical connector, the second electrical connector, the first fixing member and the first fixing portion, so the structure is simple. The invention does not need to use complicated extracting mechanism, so the cost can be further reduced. Moreover, the invention may utilize the sensor to sense whether the cover is opened, so as to achieve the purpose of protecting data security.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A server comprising:
   a chassis; and
   a storage module disposed in the chassis, the storage module comprising:
      a base, a first side of the base having a first fixing portion;
      a first electrical connector disposed at a second side of the base, the second side being opposite to the first side;
      a storage device having a second electrical connector;
      a connecting member connected to the storage device; and
      a first fixing member disposed on the connecting member;
      wherein the second electrical connector is connected to the first electrical connector and the first fixing member is fixed to the first fixing portion, so as to fix the storage device on the base;
      wherein the first fixing member is detached from the first fixing portion and the second electrical connector is separated from the first electrical connector, so as to detach the storage device from the base.
2. The server of claim 1, wherein the base has a guiding structure and the guiding structure guides the storage device to align the second electrical connector with the first electrical connector.
3. The server of claim 1, wherein the second side of the base has a restraining portion; after the second electrical connector is connected to the first electrical connector, the restraining portion is located above the storage device.
4. The server of claim 3, wherein the base has two side walls, the two side walls are opposite to each other, and the restraining portion is connected to the two side walls.
5. The server of claim 1, wherein the storage device has a through hole, the connecting member has a second fixing portion, the storage module further comprises a second fixing member, and the second fixing member passes through the through hole to be fixed to the second fixing portion.
6. The server of claim 1, wherein the storage module further comprises a third fixing member, the third fixing member is disposed on the first side of the base, a bottom plate of the chassis has a third fixing portion, and the third fixing member is fixed to the third fixing portion to fix the base on the bottom plate.

7. The server of claim 1, wherein a bottom plate of the chassis has an engaging portion, the base has an engaging groove, and the engaging portion engages with the engaging groove to fix the base on the bottom plate.

8. The server of claim 7, wherein the base has an avoidance recess and the engaging groove is located in the avoidance recess.

9. The server of claim 1, further comprising a sensor disposed in the chassis, a cover of the chassis covering the storage module, the sensor sensing whether the cover is opened.

10. The server of claim 9, wherein the cover has a protruding portion and a position of the protruding portion corresponds to a position of the sensor; when the cover is not opened, the protruding portion abuts against a sensing end of the sensor; when the cover is opened, the protruding portion moves away from the sensing end of the sensor, such that the sensor outputs a sensing signal.

11. The server of claim 9, further comprising a processor and an alarm device, the processor being coupled to the sensor and the alarm device, wherein, when the cover is opened, the sensor outputs a sensing signal to the processor and the processor controls the alarm device to send out a warning message according to the sensing signal.

12. The server of claim 9, further comprising a processor and a communication module, the processor being coupled to the sensor and the communication module, wherein, when the cover is opened, the sensor outputs a sensing signal to the processor and the processor controls the communication module to send out a warning message to an external device according to the sensing signal.

13. A storage module comprising:
    a base, a first side of the base having a first fixing portion;
    a first electrical connector disposed at a second side of the base, the second side being opposite to the first side;
    a storage device having a second electrical connector;
    a connecting member connected to the storage device; and
    a first fixing member disposed on the connecting member;
    wherein the second electrical connector is connected to the first electrical connector and the first fixing member is fixed to the first fixing portion, so as to fix the storage device on the base;
    wherein the first fixing member is detached from the first fixing portion and the second electrical connector is separated from the first electrical connector, so as to detach the storage device from the base.

14. The storage module of claim 13, wherein the base has a guiding structure and the guiding structure guides the storage device to align the second electrical connector with the first electrical connector.

15. The storage module of claim 13, wherein the second side of the base has a restraining portion; after the second electrical connector is connected to the first electrical connector, the restraining portion is located above the storage device.

16. The storage module of claim 15, wherein the base has two side walls, the two side walls are opposite to each other, and the restraining portion is connected to the two side walls.

17. The storage module of claim 13, wherein the storage device has a through hole, the connecting member has a second fixing portion, the storage module further comprises a second fixing member, and the second fixing member passes through the through hole to be fixed to the second fixing portion.

18. The storage module of claim 13, further comprising a third fixing member, the third fixing member being disposed on the first side of the base.

19. The storage module of claim 13, wherein the base has an engaging groove and an avoidance recess, and the engaging groove is located in the avoidance recess.

* * * * *